United States Patent [19]

Mizuta

[11] Patent Number: 5,127,097
[45] Date of Patent: Jun. 30, 1992

[54] MEMORY WRITING APPARATUS

[75] Inventor: Masaharu Mizuta, Itami, Japan

[73] Assignee: Mitsubishi Denki Kabushiki Kaisha, Japan

[21] Appl. No.: 638,150

[22] Filed: Jan. 9, 1991

Related U.S. Application Data

[63] Continuation of Ser. No. 268,183, Nov. 7, 1988, abandoned.

[30] Foreign Application Priority Data

Nov. 9, 1987 [JP] Japan ................ 62-282819

[51] Int. Cl.5 .............. G06F 13/00; G06F 11/30
[52] U.S. Cl. .................. 395/425; 365/94; 365/230.03
[58] Field of Search ... 364/200 MS File, 900 MS File; 365/94, 230.03

[56] References Cited

U.S. PATENT DOCUMENTS 4,093,998 6/1978 Miller .................. 364/900
4,578,751 3/1986 Erwin .................. 364/200

Primary Examiner—Gareth D. Shaw
Assistant Examiner—John Loomis
Attorney, Agent, or Firm—Leydig, Voit & Mayer

[57] ABSTRACT

A memory writing apparatus for simultaneously writing the same data in a plurality of memories such as PROMs, the apparatus having a master function portion and slave function portions connected to the master function portion. A plurality of memories in which the desired data is to be written by the master function portion are placed in a memory placing section provided in each of the master and slave function portions. The master function portion has a buffer memory which stores the data to be written. Each of the main and slave function portions has a decision circuit for comparing the data actually written in each of the memories with the data stored in the buffer memory.

6 Claims, 4 Drawing Sheets

MEMORY WRITING APPARATUS

This application is a continuation of application Ser. No. 07/268,183, filed Nov. 7, 1981, now abandoned.

BACKGROUND OF THE INVENTION

1. Field of the Invention

This invention relates to a memory writing apparatus and more particularly to a PROM writer or gang writer for writing data in a plurality of memories such as PROMs.

2. Description of the Related Art

A PROM writer is a system for writing data in a memory, e.g., an EPROM, OTP, EEPROM, or RAM. A gang writer is known as a type of PROM writer which simultaneously writes data in a plurality of memories.

For instance, it is possible for one gang writer to simultaneously write data in eight, sixteen or thirty two 256 kbit EPROMs. Generally, several tens to several hundreds of such gang writers are provided in a memory department of a memory maker in which desired items of data are written in memories before the memories are shipped.

FIG. 1 shows a basic construction of conventional gang writers. A gang writer A shown in FIG. 1 has an operational section 1 to which an interface circuit 2 is connected. A write control circuit 3 is connected to the interface circuit 2, an a buffer memory (or a master memory) 4 to which a decision circuit 5 is connected is connected to the write control circuit 3. A memory holding section 7 is connected to the interface circuit 2. A power supply circuit 6 for supplying necessary power to the components of the gang writer A, namely, the circuits 1 to 5 and a plurality of memories 71 disposed in the memory holding section 7 is also provided in the gang writer A.

A gang writer B disposed adjacent to the gang writer A has the same construction as that of the gang writer A. A host computer (not shown) is connected to the interface circuits 2 of these gang writers.

The operation of these gang writers will be described below with reference to the flow chart of FIG. 2.

After the power supply circuits 6 of the gang writers A and B have been turned on (step 8), the plurality of memory modules 71 in which desired data will be written are placed in the memory holding section 7 (step 9), and items of data to be written are prepared (step 10). That is, the buffer memories 4 are loaded with items of data to be written which are supplied from the host computer via the interface circuits 2.

Thereafter, a blank check of each of the memories 71 placed the memory clearing sections 7 is performed by the write control circuit 3 in order to check whether or not the memory 71 contains no data (step 11). The blank check is performed for every memory 71 placed in the memory holding section 7 incrementally (step 12a).

The data in the buffer memory 4 is written in each memory 71 by the write control circuit 3, and comparison between the data written in the memory 71 and the data stored in the buffer memory 4 is made by the decision circuit 5 (step 14). The comparison (12b) is then repeated so that the step 14 is conducted with respect to all the memories 71. Thereafter, the data is read out from each memory 71 by the write control circuit 3 and a comparison between the data thereby read out and the data in the buffer memory 4 is performed (step 15). The step 15 is also conducted with respect to all the memories 71 incrementally (step 12c).

If an abnormality is detected in step 11, 14, or 15, the process proceeds to the step 13 to start error processing.

After the process of writing the data in the memories 71 has been completed, the memories 71 are removed from each memory holding section 7 (step 16), and the power supply circuits 6 are turned off (step 17).

In the conventional system, however, only eight to thirty two memories can be written with data by one gang writer. It is therefore necessary for a semiconductor maker to prepare a large number of gang writers in order to mass-produce and ship written memories, and a large investment and a large installation area are therefore needed. There is also a problem in distributing data to respective gang writers.

SUMMARY OF THE INVENTION

In view of these problems, it is an object of the present invention to provide a writing apparatus for easily writing memories with improved efficiency at a low cost.

To this end, the present invention provides a memory writing apparatus for simultaneously writing the same data in a plurality of memories, the memory writing apparatus comprising: a plurality of slave function portions in each of which a plurality of memories are placed; and a master function portion connected to the plurality of slave function portions for writing the data in the memories placed in each of the slave function portions.

DESCRIPTION OF THE PREFERRED EMBODIMENTS

Embodiments of the present invention will be described below with reference to the accompanying drawings.

Figure 1:
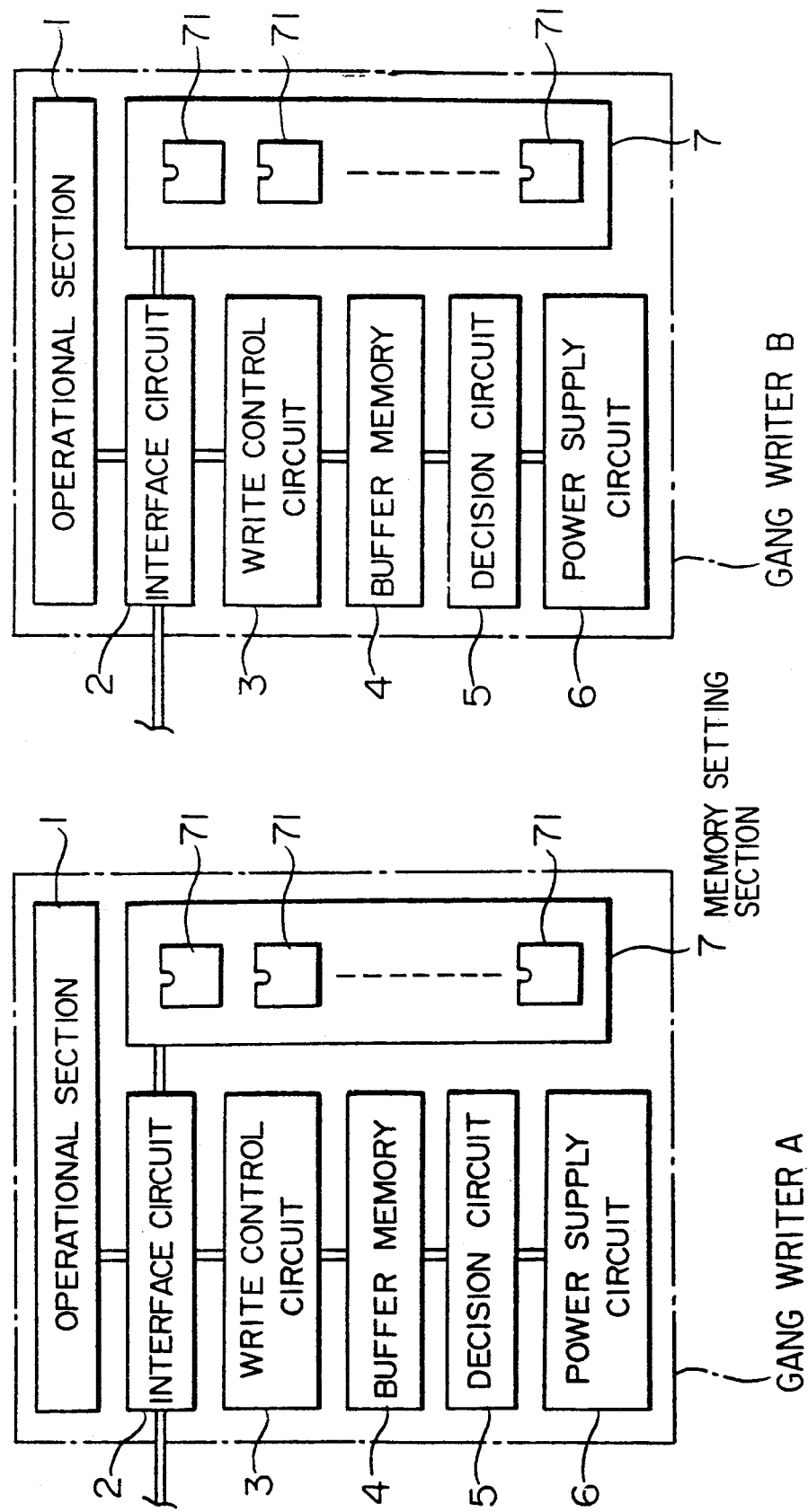
FIG. 1 is a block diagram of the construction of a conventional memory writing apparatus.
Figure 3:
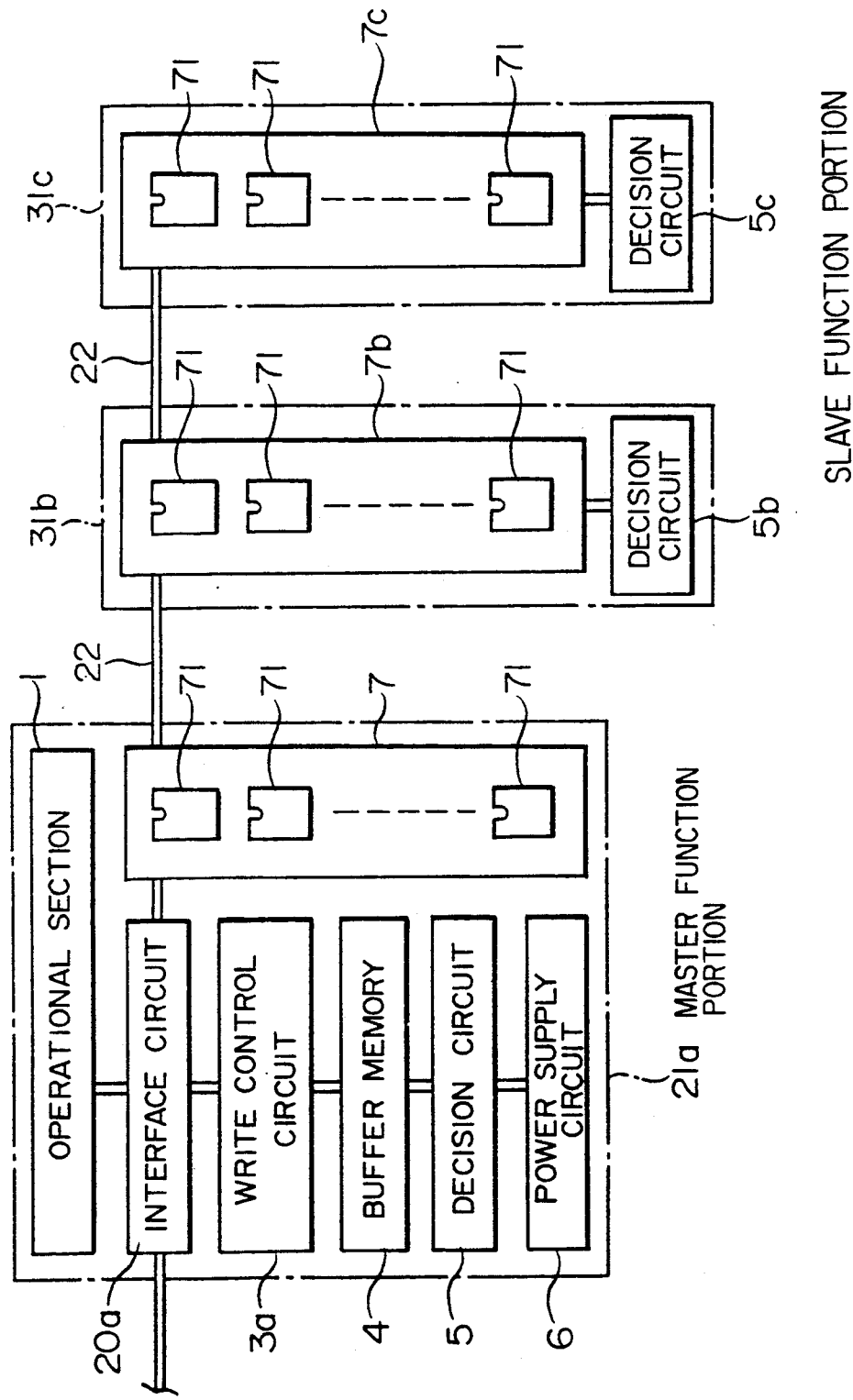
FIG. 3 is a block diagram of the construction of a memory writing apparatus in accordance with an embodiment of the present invention.

Referring to FIG. 3, a memory writing apparatus has a master function portion 21a and slave function portions 31b and 31c connected to the master function portion 21a by a bus 22. The master function portion 21a has a construction similar to that of the gang writer A shown in FIG. 1. That is, an interface circuit 20a is connected to an operational section 1, a write control circuit 3a is connected to the interface circuit 20a, and a buffer memory (or a master memory) 4 to which a decision circuit 5 is connected is connected to the write control circuit 3a. A memory holding section 7 is connected to the interface circuit 2. A power supply circuit 6 for supplying necessary power to the components of the master function portion 21a, namely, the above circuits and a plurality of memories 71 disposed in the memory holding section 7 is also provided in the master function portion 21a.

The slave function portions 31b and 31c have memory holding sections 7b and 7c in each of which a plurality of memories 71 is placed, and decision circuits 5b and 5c. The decision circuits 5b and 5c decide whether or not correct data has been written in each of the memories 71 placed in the memory holding sections 7b and 7c. The number of slave function portions to be connected to the master function portion 21a is selected depending upon the total number of memories 71 to be written with data. The memory holding sections 7b and 7c and the decision circuits 5b and 5c of the slave function portions 31b and 31c are also supplied with power from the power supply circuit 6 of the master function portion 21a.

Figure 2:
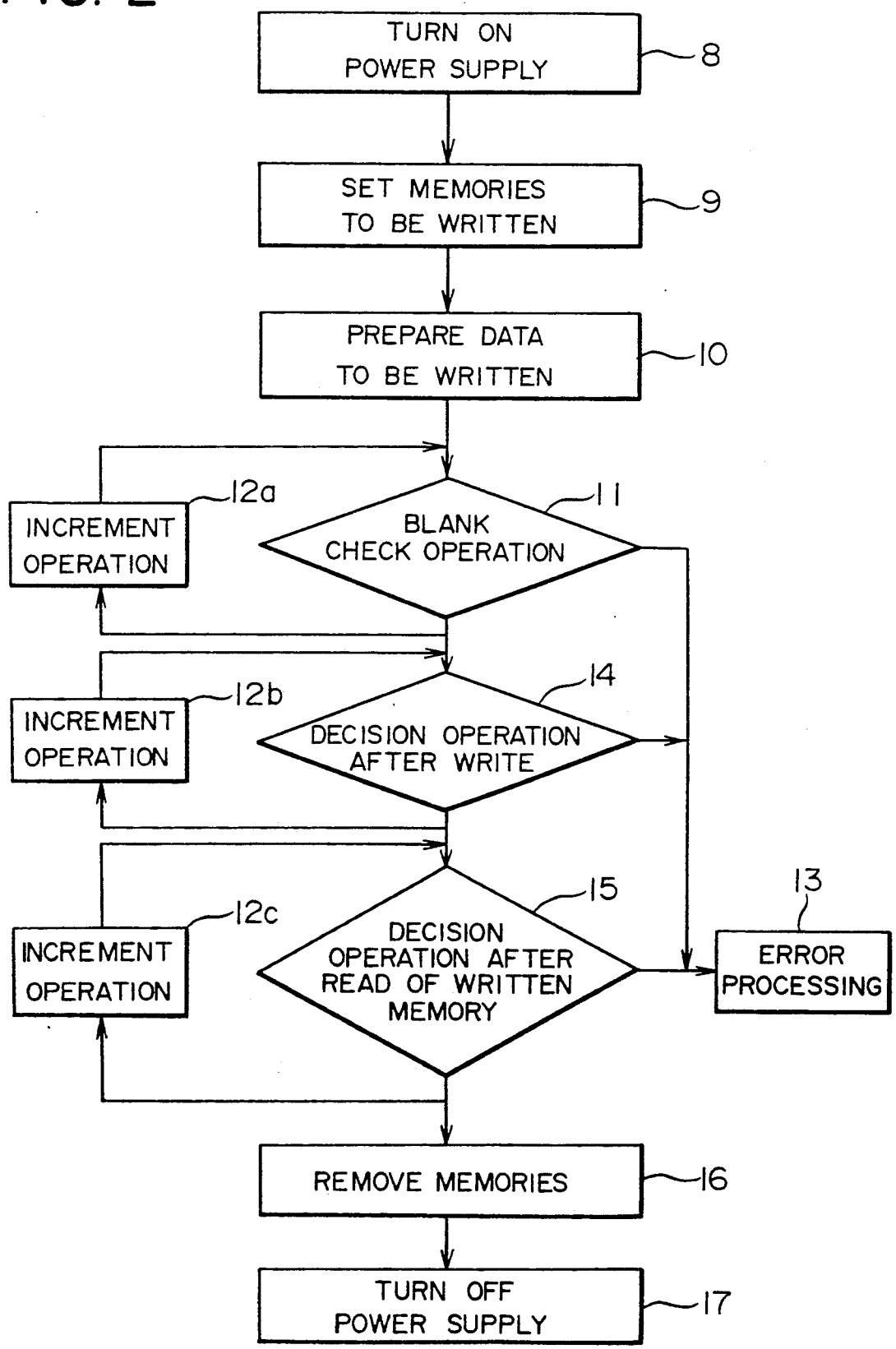
FIG. 2 is a flow chart of the operation of the apparatus shown in FIG. 1.

The operation of the thus-constructed memory writing apparatus is substantially the same as that of the conventional system based on the flow chart of FIG. 2.

After the power supply circuit 6 has been turned on, the write control circuit 3a of the master function portion 21a determines the number of slave function portions 31b and 31c to be connected to the master function portion 21a. In the arrangement shown in FIG. 3, two slave function portions 31b and 31c are connected to the master function portion 21a. The number N of memories 71 which are to be simultaneously written with data is calculated from the number of slave function portions connected to the master function portion 21a. Thereafter, the memories 71 to be written with data are placed in the memory holding sections 7, 7b, and 7c of the master function portion 21a and the slave function portions 31b and 31c. The buffer memory 4 of the master function portion 21a is loaded with data to be written which are supplied via the interface circuit 20a of the master function portion 21a from the host computer preliminarily connected thereto.

Thereafter, blank check is performed by the write control circuit 3a with respect to N memories 71 placed in each of the memory holding sections 7, 7b, and 7c. All of the N memories 71 are successively written with the data stored in the buffer memory 4 by the write control circuit 3a, and a comparison between the data written in each memory 71 and the data in the buffer memory 4 is performed. The comparison of the data in each of the memories 71 placed in the memory holding section 7 of the master function portion 21a is performed by the decision circuit 5 provided in the master function portion 21a while the comparison of the data in each of the memories 71 placed in the memory holding section 7b or 7c of the slave function portion 31b or 31c is performed by the decision circuit 5b or 5c of the slave function portion 31b or 31c.

After all the memories 71 have been written with the data in this manner, the data in each memories 71 is read out by the write control circuit 3a of the master function portion 21a, and a comparison between the data thereby read out and the data stored in the buffer memory 4 is performed. This comparison is also performed by the decision circuit 5 of the master function portion 21a with respect to the memories 71 placed in the memory holding section 7 of the master function portion 21a or by the decision circuit 5b or 5c of the slave function portion 31b or 31c with respect to the memories placed in the memory holding section 7b or 7c of the slave function portion 31b or 31c. The efficiency of data write decision with respect to the N memories 71 is thereby improved.

If an abnormality is detected as a result of the above-described blank check and the data writing, error processing is conducted for the memory 71 relating to the abnormality.

After the process of writing the data in each memory 71 has been completed, the memories 71 are removed from the memory holding section 7, 7b, and 7c, and the power supply circuit 6 of the master function portion 21a is turned off.

In this embodiment, as described above, a specific number of slave function portions determined depending on the number of memories 71 as required are connected to the master function portion 21a and the system is designed to write data in all of the memories 71 thus connected by the master function portion 21a, thereby enabling data writing into a large number of memories 71 by the use of only one master function portion.

The buffer memory 4, which is loaded with data to be written in the memories 71, may be replaced with a master memory which has previously been written with the desired data so that the data in this memory is written into each memory 71 under the control of the write control circuit 3a.

An instruction to start data writing may be issued from the operational section 1 of the master function portion 21a or from the host computer connected to the interface circuit 20a.

Figure 4:
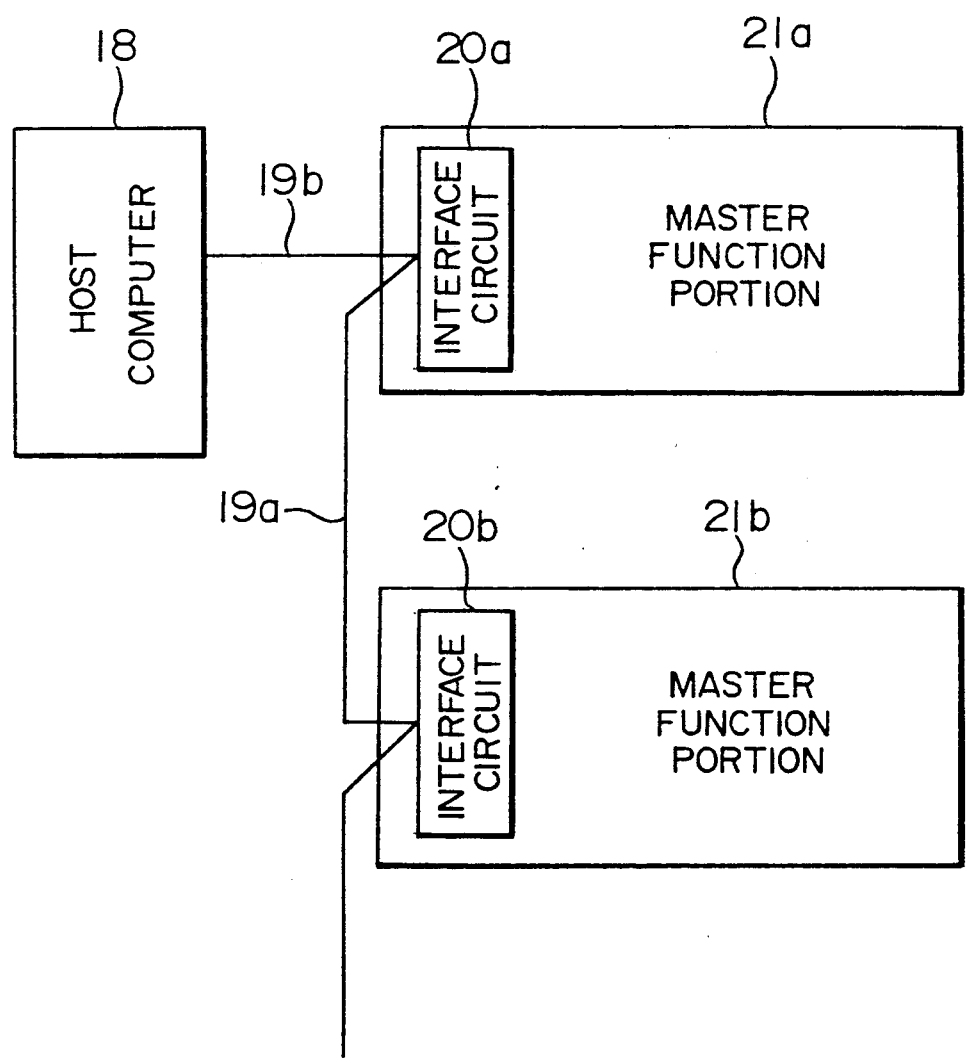
FIG. 4 is a block diagram of a memory writing system employing the apparatus shown in FIG. 3.

FIG. 4 shows another system in which interface circuits 20a, 20b, ... of a plurality of master function portions 21a, 21b, ... of the same construction are connected with each other via a bus 19a; and a host computer 18 used in common for the main function portions 21a, 21b, ... is connected via a bus 19b to the interface circuit 20a of the master function circuit 21a. This system also enables a large number of memories to be written at one time and such a system having a large capacity can readily be constructed by connecting master function portions to the bus 19a. The desired number of slave function portions, which is determined depending on the number of memories to be written, are connected to the master function portions 21a, 21b, .... The bus 19a and 19b may be constituted by a GPIB or SCSI.

As described above, each slave function portion of the memory writing apparatus of the present invention has no interface circuit or power supply circuit. At the same time, it requires no buffer memory of an increased capacity. It is therefore possible to provide a mass-writing type of gang writer which has an overall low cost.

In the above-described embodiments, the present invention is applied to writing in ordinary memories. However, the present invention can also be applied to writing of memory cards or IC cards having a multiplicity of memory devices while achieving the same effects as the above-described embodiments. It is particularly advantageous to use a common buffer memory containing the data to be written to a memory card having a large capacity of, e.g., 8 Mbytes. In the above-described embodiments, the memory holding section 7 is included in the master function portion 21a. However, the master function portion 21a need not include the memory holding section 7 and this section can be provided in a slave function portion disposed outside the master function portion 21a.

What is claimed is:

1. A memory writing apparatus for simultaneously writing identical data into a plurality of memories comprising:

a plurality of slave function portions each consisting of a memory holding portion, in which a plurality of memories may be placed, and decision circuit;

a master function portion connection to said plurality of slave function portions including a buffer memory which stores data which is written into each of the memories placed in each of said slave function portion;

wherein the decision circuits of each of said slave function portions compare the contents of the buffer memory with the contents of the plurality of memories of the respective slave function portions and generating an abnormality signal when the data written in the memories of the slave function portion does not correspond to the data stored in the buffer memory.

2. An apparatus according to claim 1 comprising a master memory holding portion provided in said master function portion in which a plurality of memories are;

3. An apparatus according to claim 2 comprising a decision circuit provided in said master function portion for comparing the contents of each of said memories place in said master memory holding portion with the contents of the buffer memory to detect abnormalities and for performing error processing when an abnormality is detected.

4. An apparatus for simultaneously programming predetermined data into each of a plurality of memories comprising:

a master function portion including an interface circuit in electrical communication with an external bus, a buffer memory for storing predetermined data, a write control circuit for transmitting the predetermined data over the external bus, an internal bus which connects the write control circuit, the interface circuit, and the buffer memory and a memory holding section containing a plurality of memories connected to the interface circuit; and a plurality of slave function portions, each slave function portion including a memory holding portion for detachably holding the plurality of memories to be programmed, each slave function portion being connected to the external bus for receiving the predetermined data transmitted by the write control circuit to be programmed into the plurality of memories under control of the write control circuit, each slave function portion and said master function portion further including a decision circuit for reading the data programmed into the memories and comparing the data read from the memories with the data stored in the buffer memory of said master function and generating an abnormality signal when the data read from the memories in the slave function portion does not correspond to the data stored in the buffer memory portion to verify that the memories were programmed correctly.

5. A memory writing apparatus for simultaneously writing identical data into a plurality of memories comprising:

a plurality of slave function portions each including a memory holding portion in which a plurality of memories are placed; and a master function portion including a buffer memory, a write control circuit and a memory holding section having a plurality of memories electrically connected to a number of slave function portions for writing the data from the buffer memory into each of the memories placed in each of said slave function portions, where the number of slave function portions is determined according to a total number of memories to be written with data;

each of said slave function portions being electrically connected to said master function portion via a bus line and including a decision circuit which reads the data contained in the memories of the respective slave function portions and compares the read data with data contained in the buffer memory and generates an abnormality signal when the data read from memories of a slave function portion is not identical to the data stored in the buffer memory.

6. A memory writing apparatus for simultaneously writing identical data into a plurality of memories comprising:

a plurality of slave function portions each including a memory holding portion in which a plurality of memories are placed; and a plurality of master function portions each including a respective interface circuit, a buffer memory and a memory holding portion having a plurality of memories, the interface circuits being connected through a bus line and said master function portions being in electrical communication with said plurality of slave function portions;

each of said slave function portions being disposed external to respective master function portions and having a decision circuit which compares the contents of the buffer memory of the respective master function portion with the contents of the memories of the plurality of slave function portions and generates an abnormality signal when the content of the buffer memory is different from the content of a selected memory in a selected slave function portion.

* * * * *

UNITED STATES PATENT AND TRADEMARK OFFICE
CERTIFICATE OF CORRECTION

PATENT NO. : 5,127,097

DATED : June 30, 1992

INVENTOR(S) : Masaharu Mizuta

It is certified that error appears in the above-identified patent and that said Letters Patent is hereby corrected as shown below:

Claim 2, column 5, line 16, change ";" to --placed--.

Signed and Sealed this

Ninth Day of November, 1993

Attest:

Attesting Officer

BRUCE LEHMAN

Commissioner of Patents and Trademarks